(12) United States Patent
Mizuta

(10) Patent No.: US 6,414,500 B1
(45) Date of Patent: Jul. 2, 2002

(54) TEST SOCKET FOR AN ELECTRONIC CIRCUIT DEVICE HAVING IMPROVED CONTACT PINS AND MANUFACTURING METHOD THEREOF

(75) Inventor: Masaharu Mizuta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/427,942

(22) Filed: Oct. 27, 1999

(30) Foreign Application Priority Data

May 14, 1999 (JP) .......................................... 11-134959

(51) Int. Cl.[7] .............................................. G01R 31/02
(52) U.S. Cl. ....................................... 324/754; 324/755
(58) Field of Search ................................ 324/755, 754; 29/846

(56) References Cited

U.S. PATENT DOCUMENTS

| | | | | |
|---|---|---|---|---|
| 3,998,374 A | * | 12/1976 | Cranston et al. ............. | 324/754 |
| 4,558,590 A | * | 12/1985 | Desai et al. .................. | 73/104 |
| 4,853,277 A | * | 8/1989 | Chant ........................ | 428/209 |
| 5,093,153 A | * | 3/1992 | Brochot et al. ............... | 427/489 |
| 5,188,887 A | * | 2/1993 | Linge et al. ................. | 428/216 |
| 5,206,093 A | * | 4/1993 | Masaki et al. ............... | 428/651 |
| 5,242,560 A | * | 9/1993 | Lingle et al. ........... | 204/192.27 |
| 5,519,332 A | * | 5/1996 | Wood et al. ................. | 324/755 |
| 5,559,444 A | * | 9/1996 | Farnworth et al. ........... | 324/754 |
| 5,764,070 A | * | 6/1998 | Pedder ....................... | 324/755 |
| 5,925,479 A | * | 7/1999 | Wei et al. ...................... | 429/91 |
| 5,977,783 A | * | 11/1999 | Takayama et al. .......... | 324/754 |
| 5,982,183 A | * | 11/1999 | Sano ......................... | 324/754 |
| 5,982,185 A | * | 11/1999 | Farnworth .................. | 324/755 |
| 6,055,723 A | * | 5/2000 | Akerling et al. ............... | 29/843 |
| 6,060,891 A | * | 5/2000 | Hembree et al. ........... | 324/754 |

FOREIGN PATENT DOCUMENTS

| JP | 5-304230 | 11/1993 |
|---|---|---|
| JP | 6-322518 | 11/1994 |

* cited by examiner

Primary Examiner—N. Le
Assistant Examiner—Wasseem H. Hamdan
(74) Attorney, Agent, or Firm—McDermott, Will & Emery

(57) ABSTRACT

The surface of a contact pin to contact a lead is shaped into a curved surface. After the surface of a contact pin base member made of beryllium copper or the like is plated with gold, the gold surface is coated first with a nickel or titanium thin film and then with a tungsten, chromium, or titanium thin film by sputtering. Alternatively, a contact pin base member made of beryllium copper that is not plated with gold is coated first with a nickel or titanium thin film and then with a tungsten, chromium, or titanium thin film by sputtering.

5 Claims, 4 Drawing Sheets

Fig. 5  *PRIOR ART*
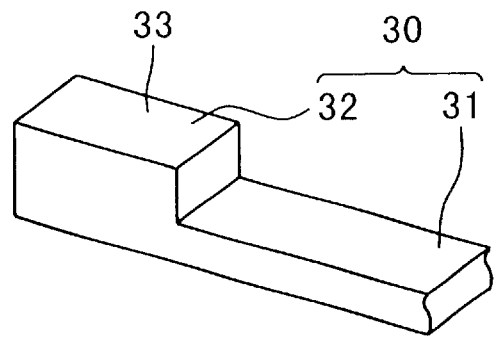
Fig. 6  *PRIOR ART*
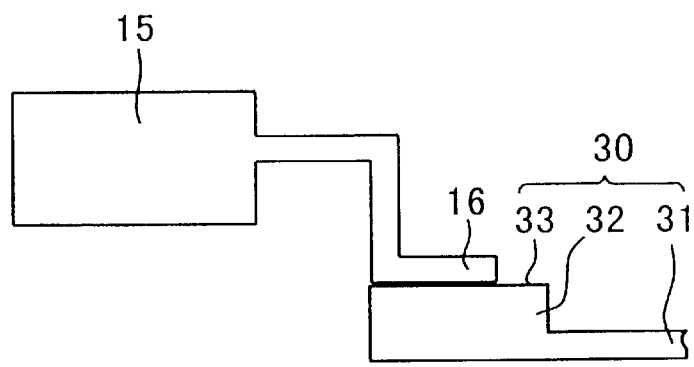
Fig. 7  *PRIOR ART*
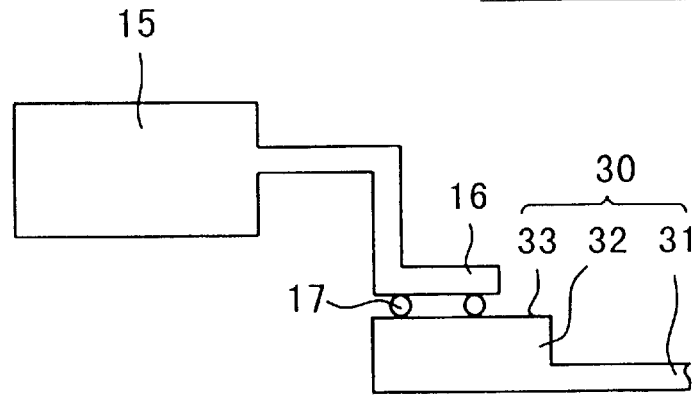

TEST SOCKET FOR AN ELECTRONIC CIRCUIT DEVICE HAVING IMPROVED CONTACT PINS AND MANUFACTURING METHOD THEREOF

BACKGROUND OF THE INVENTION

1. Field of the Invention

The present invention relates to a test socket that is used in testing a semiconductor integrated circuit (hereinafter abbreviated as IC when appropriate). In particular, the invention relates to a structure of contact pins, and a manufacturing method thereof, that are incorporated in a socket and brought into contact with the respective leads of an IC.

2. Background Art

FIGS. 5–8 show a contact pin of a conventional test socket that is used in testing a semiconductor integrated circuit or the like. FIG. 5 is a perspective view showing the structure of a tip portion of a conventional contact pin. FIGS. 6 and 7 are sectional views showing contact states of an IC lead and the contact pin of FIG. 5. FIG. 8 is a sectional view of a tip portion of the contact pin of FIG. 5 and shows its materials and structure.

As shown in FIG. 5, the conventional contact pin 30 is configured in such a manner that a contact portion 32 having a flat contact surface 33 is provided at the tip of a base portion 31 that exhibits spring action as a whole.

As shown in FIG. 6, an IC 15 is tested by bringing the contact surfaces 33 of the contact pins 30 into contact (electrical contact) with leads 16 of the IC 15.

In performing a test, particularly a final test, on an IC, in many cases, the leads of the IC have been plated with solder for subsequent mounting on a printed circuit board. An IC good/defective judgment is made by performing an electrical characteristic test in a state that electrical connections are established by bringing the contact pins of a socket into contact with the leads of the IC in such a state.

As the above IC test is repeated, as shown in FIG. 7, solder fragments 17 of the IC leads 16 are accumulated on the surfaces of the contact pins 30 and the leads 16 come into contact with the solder fragments 17. This causes a problem that the dispersion and the magnitude of the contact resistance increase.

FIG. 8 is a sectional view showing the materials and the structure of the contact portion 32 of the conventional contact pin 30. In FIG. 8, reference numeral 21 denotes a pin spring base member made of beryllium copper or the like, numeral 22 denotes a nickel plating undercoat (nickel thin film) of several micrometers in thickness, and numeral 23 denotes a gold plating layer (gold thin film) of 0.2–0.3 μm in thickness.

That is, to have a small electrical resistance value and not to be oxidized under a low-temperature or high-temperature environment so as to exhibit insulation resistance, in most cases, socket contact pins are manufactured by plating the beryllium copper contact base member 21 having resilience first with nickel and then with gold.

While the gold plating layer 23 has advantages that, for example, it has a small electrical resistance value in various environments and is not oxidized in a low-temperature or high-temperature environment so as to exhibit insulation resistance, it has disadvantages that it is prone to form oxides with tin and lead that are components of plated solder of IC leads (i.e., it is prone to cause what is called a "solder transition" phenomenon) and, in particular, lead oxide increases the electrical contact resistance and cause a contact failure (connection failure) as deterioration with age.

Although plating layers other than the gold plating layer, such as a nickel plating layer, a tin plating layer, a silver plating layer, and a rhodium plating layer, are used for special purposes, they have the common problems as stated below.

As described above, in general, conventional contact pins have level contact surfaces that are to be brought into contact with IC leads or the like, and are used in such a state. Therefore, solder fragments of IC leads tend to deposit on the contact surfaces of contact pins.

Further, since the surfaces of conventional contact pins are plated with gold, a phenomenon tends to occur that solder plating layers of IC leads cause "solder transition" on the surfaces of the contact pins. This phenomenon increases the contact resistance value and may cause a connection failure, to prevent an electrical characteristic test from being performed correctly. As a result, the production yield is lowered or it becomes necessary to perform operations of "cleaning" and "polishing" to remove oxides of tin and lead, which lowers the productivity and requires extra costs.

The present invention has been made to solve the above problems in the conventional art, and an object of the invention is therefore to provide contact pins, as well as a test socket having such contact pins, that are free of a problem that solder plating layers of ICs cause the "solder transition" on the surfaces of the contact pins to cause a contact failure or the like.

Another object of the invention is to provide a manufacturing method of the above test socket.

SUMMARY OF THE INVENTION

According to one aspect of the present invention, a test socket for an electronic circuit device has a contact pin that is to be brought into electrical contact with a lead of the electronic circuit device, and a contact surface of the contact pin to contact the lead assumes a curved surface.

In another aspect of the present invention, the contact pin is preferably formed by coating a surface of a contact pin base member with a gold thin film, then with a nickel or titanium thin film, and then with a tungsten, chromium, or titanium thin film.

In another aspect of the present invention, the contact pin is preferably formed by coating a surface of a contact pin base member made of beryllium copper, phosphor bronze, or spring steel with a nickel or titanium thin film, and then with a tungsten, chromium, or titanium thin film.

Other and further objects, features and advantages of the invention will appear more fully from the following description.

BRIEF DESCRIPTION OF THE DRAWINGS

FIG. 5 is a perspective view showing a structure of a tip portion of a conventional contact pin used in a conventional test socket.

FIGS. 6 and 7 are sectional views showing contact states of an IC lead and the contact pin of FIG. 5.

DETAILED DESCRIPTION OF THE PREFERRED EMBODIMENTS

Some preferred embodiments of the present invention will be described with reference to the drawings.

First Embodiment

Figure 1:
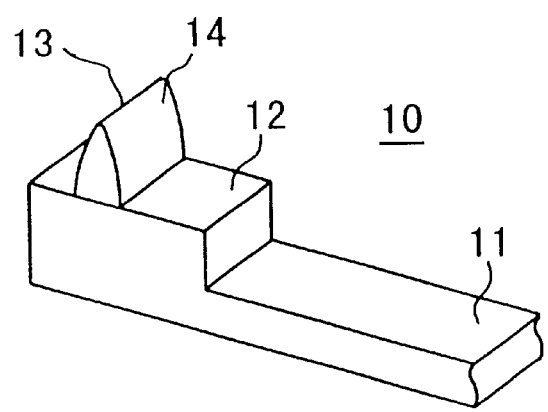
FIG. 1 is a perspective view showing a structure of a tip portion of a contact pin according to a first embodiment of the present invention.
Figure 2:
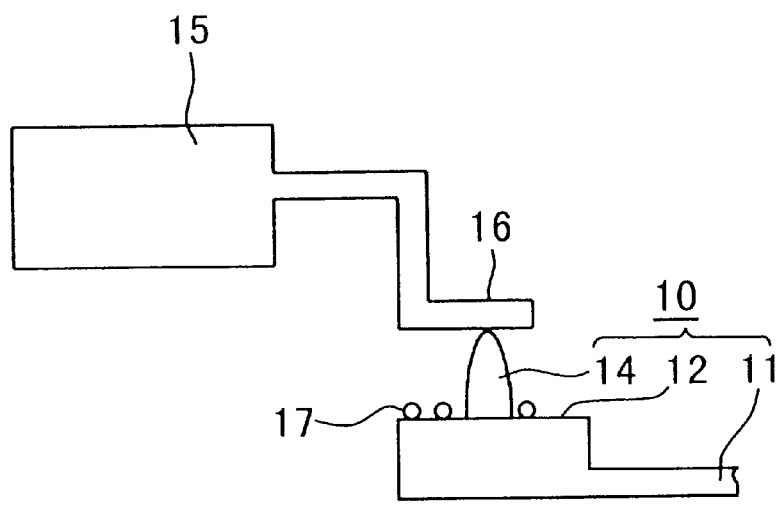
FIG. 2 is a sectional view showing a contact state of an IC lead or the like and the contact pin of FIG. 1.
Figure 3:
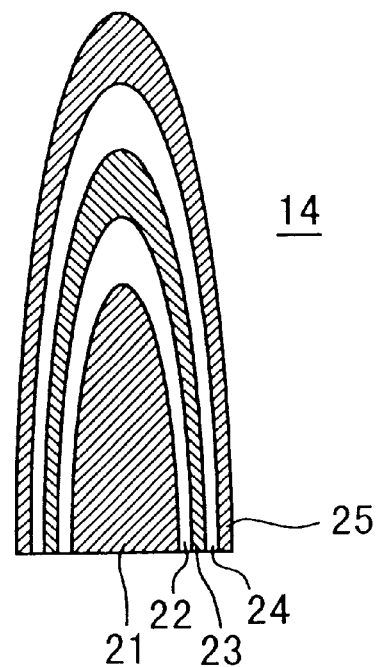
FIG. 3 is a sectional view showing the materials and the structure of the contact pin of FIG. 1.

FIGS. 1–3 show a contact pin of a test socket for an electronic circuit device according to a first embodiment of the present invention. FIG. 1 is a perspective view showing an example structure of a tip portion of a contact pin according to this embodiment. FIG. 2 is a sectional view showing a contact state of an IC lead or the like and the contact pin of FIG. 1. FIG. 3 is a sectional view showing the materials and the structure of the contact pin of FIG. 1.

As shown in FIG. 1, the contact pin 10 according to this embodiment is configured in such a manner that a contact portion 14 having a curved contact surface 13 is provided on a tip portion 12 of a base portion 11 that exhibits spring action as a whole. The contact surface 13 and its vicinity of the contact portion 14 are shaped like the surface of a cylinder having a radius of curvature of 0.1 μm, for example. The bottom portion of the contact portion 14, which becomes wider toward the bottom, is fixed to the tip portion 12.

As for the contact with an IC lead or the like, as shown in FIG. 2, the contact surface 13 of the contact portion 14 contacts a lead 16 or the like of an IC 15 in line form and electrical contact is thereby established. Even if at this time solder fragments 17 of the IC lead 16 are transferred onto the surface of the contact pin 10, they do not stay on the contact surface 13 of the contact portion 14 and drop on the flat portions of the tip portion 12. The contact between the contact surface 13 and the IC lead 16 self-cleans the contact surface 13, whereby the contact surface 13 is always kept clean and low-resistance electrical contact is maintained.

FIG. 3 shows an example of the materials and the structure of the contact portion 14 of the contact pin 10 according to this embodiment. In FIG. 3, reference numeral 21 denotes a pin spring base member (contact pin base member) made of beryllium copper, phosphor bronze, or spring steel, numeral 22 denotes a nickel plating thin film, numeral 23 denotes a gold plating thin film, numeral 24 denotes a sputtered nickel thin film, and numeral 25 denotes a sputtered tungsten thin film.

The contact pin 10 is the same as the conventional one to the extent that the spring base member 21 of beryllium copper or the like is coated with the nickel plating thin film 22 and the gold plating thin film 23. However, in the contact pin 10, the nickel thin film 24 and the tungsten thin film 25 are formed on the gold thin film 23 by sputtering.

The nickel thin film 24 is provided to improve the adhesion and the coherence, and may be replaced by a titanium thin film, a chromium thin film, or the like. The uppermost metal layer that does not cause "solder transition" may be preferably made of chromium, titanium, or the like, as well as tungsten. In this embodiment, from the viewpoint of economy etc., the thickness of the undercoat thin film such as nickel or the like is set at 0.5 μm and that of the overlying tungsten thin film is set at 1 μm.

The reason why tungsten or nickel is used for the uppermost layers is that these metals, above all, do not tend to be oxidized, are resistant to abrasion to some extent, and have small electrical resistance values as follows (volume resistivity):

Chromium (comparative example): $17\times10^{-8}\Omega\cdot m$.

Nickel: $7.2\times10^{-8}\Omega\cdot m$

Tungsten: $5.5\times10^{-8}\Omega\cdot m$

Aluminum is not used because it is prone to be oxidized though it has a small volume resistivity value of $2.7\times10^{-8}\Omega\cdot m$.

In the above example, the nickel thin film 24 and the tungsten thin film 25 as the pin surface layer is formed by "sputtering." Although the tungsten thin film 25 may be formed by a physical thin film forming method (PVD), vacuum evaporation, ion plating, or the like, "sputtering" is used in the above example in favor of its superiority in adhesion and economy.

In general, contact pins are manufactured by press working using a punching jig and resulting pin surfaces have shearing surfaces and breaking surface. Since solder usually starts to stick from rough breaking surfaces, it is more effective to make the surface smoother and less uneven, like a shearing surface, by subjecting the contact pins 10, particularly the contact portions 14, to "shaving," "blasting," "electric discharge machining," "wire cutting," or the like.

As described above, in this embodiment, the contact surface and its vicinity where the contact pin comes into contact with an IC lead is shaped like a curved surface and the outermost surface of the contact portion is made of a tungsten thin film. Therefore, not only is the sticking of solder components prevented by the measure in the physical and shape-related aspects but also the transition of solder components originating from an IC lead is prevented by the measure in the material-related aspect. As a result, the solder deposition can be prevented and hence superior electrical contact can be attained.

Second Embodiment

Figure 4:
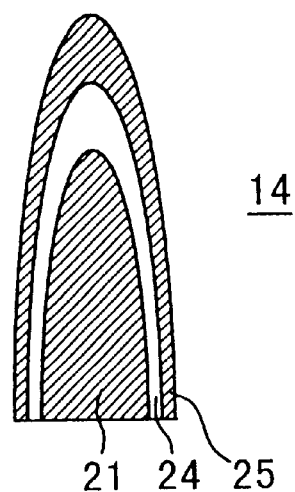
FIG. 4 is a sectional view showing the materials and the structure of a contact pin of a test socket according to a second embodiment of the invention
Figure 8:
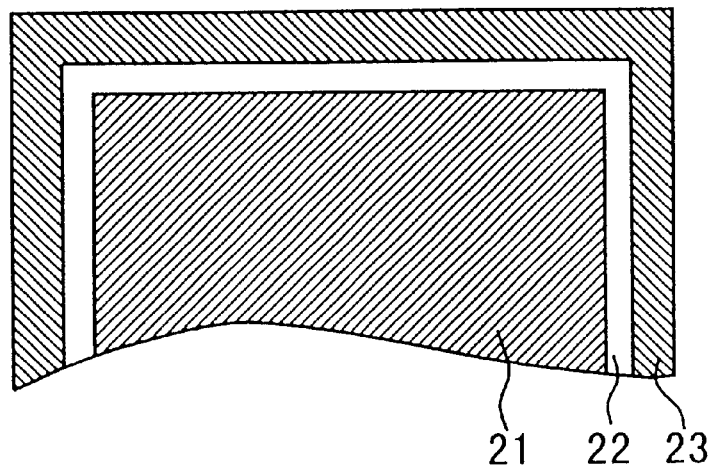
FIG. 8 is a cross sectional view of a tip portion of the contact pin of FIG. 5

FIG. 4 is a sectional view showing the materials and the structure of a contact pin of a test socket according to a second embodiment of the invention. In FIG. 4, reference numeral 21 denotes a spring base member (contact pin base member) made of beryllium copper, phosphor bronze, or spring steel, numeral 24 denotes a sputtered nickel thin film, and numeral 25 denotes a sputtered tungsten thin film.

This contact pin is manufactured by forming, on the spring base member 21 of beryllium copper or the like, the titanium thin film 24 and then the tungsten thin film 25 by sputtering. In contrast to the conventional contact pin 30 in which the spring base member 21 of beryllium copper is plated with nickel and gold, in this example the spring base member 21 of beryllium copper or the like is first plated with nickel and then coated with tungsten by sputtering.

As in the case of the First Embodiment, the nickel thin film 24 is formed to improve the adhesion and the coherence, and may be replaced by a titanium thin film, a chromium thin film, or the like. The uppermost metal layer that does not cause "solder transition" may be made of chromium, titanium, or the like, instead of tungsten. In this embodiment, from the viewpoint of economy etc., the thickness of the undercoat thin film such as nickel or the like is set at 0.5 μm and the thickness of the overlying tungsten thin film is set at 1 μm.

The reason why tungsten is used for the uppermost layer is that it does not tend to be oxidized, is resistant to abrasion to some extent, and has low electrical resistance.

Although other points described in the First Embodiment also apply to this embodiment, redundant descriptions are omitted for the sake of simplicity.

Also in this embodiment, the contact surface of the contact portion of the contact pin is shaped like a curved surface and the outermost surface of the contact portion is made of the tungsten thin film. Therefore, even if solder fragments are transferred onto the contact surface from an IC lead, they do not stay there but fall off. And the degree of transition of solder components originating from an IC lead is lowered by the measure in the material aspect. As a result, superior electrical contact can be maintained.

As described above, the contact portion of the socket contact pin according to each of the first and second embodiments is so shaped as to have a convex-strip curved surface so that solder fragments tend to fall off from it.

For example, the contact portion is so shaped as to assume part of a cylindrical surface. However, the surface shape of the contact portion is not limited to it. The intended effect can be obtained by any convex contact surface (in contrast to the conventional flat contact surface) in which the portion close to the contact position is inclined so that solder fragments do not remain there but fall off.

As described above, in the first and second embodiments, the uppermost layer (i.e., the surface layer) of the socket contact pin is formed by "sputtering" of a metal that is high in conductivity and to which solder does not tend to stick, such as tungsten, chromium, or titanium. This prevents a contact failure and dispenses with complex operations.

Conventionally, because of the "solder transition," the contact resistance of the pin surface layer that is the gold plating layer gradually increases as deterioration with age and a connection failure finally occurs. In contrast, in the invention, since the pin surface layer is formed by sputtering of tungsten or the like to which solder does not stick, the transition of solder components originating from plated solder of an IC lead does not occur, and hence low electrical resistance is maintained long between the plated solder of the IC lead and tungsten of the pin.

Although the above description is directed to the case of socket pins that are used in testing an IC, it is apparent that the invention provides the same effects even when applied to POGO pins for an in-circuit tester for performing a test between solder-connected electrical contacts on a printed circuit board. Further, the invention can be applied to devices in general that make electrical contact with the leads of other electronic circuit devices for their tests.

As described above, the invention prevents the event that the "solder transition" causes solder fragments to deposit on the surfaces of the contact pins of a test socket for an IC or the like, and thereby prevents increase of the contact resistance and occurrence of a connection failure. Therefore, the operations of "cleaning" and "polishing" pins become unnecessary and hence the cost of a test can be reduced. Further, since the contact resistance value does not increase, a test waveform used in a test is kept proper and no voltage drop occurs at the contacts. The production yield can thus be increased.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-134959, filed on May 14, 1999 including specification, claims, drawings and summary, on which the Convention priority of the present application is based, are incorporated herein by reference in its entirety.

I claim:

1. A test socket for an electronic circuit device having a contact pin that is to be brought into electrical contact with a lead of the electronic circuit device, wherein:

a contact surface of the contact pin to contact the lead assumes a curved surface; and the contact pin is formed by coating a surface of a contact pin base member with a gold thin film, coating said gold thin film with a nickel or titanium thin film, and coating said nickel or titanium thin film with a tungsten, chromium, or titanium thin film.

2. A test socket for an electronic circuit device having a contact pin that is to be brought into electrical contact with a lead of the electronic circuit device, wherein:

a contact surface of the contact pin to contact the lead assumes a curved surface; and the contact pin is formed by coating a surface of a contact pin base member made of beryllium copper, phosphor bronze, or spring steel with a nickel or titanium thin film, and coating said nickel or titanium thin film with a tungsten, chromium, or titanium thin film.

3. A method of manufacturing a test socket for an electronic circuit device having a contact pin that is to be brought into electrical contact with a lead of the electronic circuit device, comprising the steps of:

shaping a tip of a contact pin base member so as to assume a curved surface;

coating a surface of said contact pin base member with a gold thin film;

coating said gold thin film with a nickel or titanium thin film by sputtering; and coating said nickel or titanium thin film with a tungsten, chromium, or titanium thin film by sputtering.

4. A method of manufacturing a test socket for an electronic circuit device having a contact pin that is to be brought into electrical contact with a lead of the electronic circuit device, comprising the steps of:

shaping a tip of a contact pin base member made of beryllium copper, phosphor bronze, or spring steel so as to assume a curved surface;

coating a surface of said contact pin base member with a nickel or titanium thin film by sputtering; and coating said nickel or titanium thin film with a tungsten, chromium, or titanium thin film by sputtering.

5. A test socket for an electronic circuit device having a contact pin that is to be brought into electrical contact with a lead of the electronic circuit device, wherein:

the contact pin includes a contact surface having a length for contacting the lead in a line form; and the contact surface is curved in a direction perpendicular to the line.

* * * * *